United States Patent
Brice-Heames et al.

(10) Patent No.: US 6,531,344 B1
(45) Date of Patent: Mar. 11, 2003

(54) HIGH FREQUENCY GALLIUM ARSENIDE MMIC DIE COATING METHOD

(75) Inventors: Ken Brice-Heames, Mesa, AZ (US); James Landers, Mesa, AZ (US); Ronald Dee Fuller, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 212 days.

(21) Appl. No.: 09/611,043

(22) Filed: Jul. 6, 2000

(51) Int. Cl.⁷ .............................................. H01L 21/56

(52) U.S. Cl. ......................... 438/127; 438/780; 427/96

(58) Field of Search ........................... 427/96; 438/127, 438/780, FOR 395; 257/632

(56) References Cited

U.S. PATENT DOCUMENTS

| | | | | |
|---|---|---|---|---|
| 4,881,885 A | * | 11/1989 | Kovac et al. | 264/263 |
| 6,214,748 B1 | * | 4/2001 | Kobayashi et al. | 438/778 |
| 6,313,233 B1 | * | 11/2001 | Kurosawa et al. | 525/431 |
| 2002/0001973 A1 | * | 1/2002 | Wu et al. | 438/780 |

FOREIGN PATENT DOCUMENTS

| | | | | |
|---|---|---|---|---|
| JP | 58158945 A | * | 9/1983 | H01L/21/88 |

OTHER PUBLICATIONS

Military Specification, MIL–I–46058C, Dec. 1966.*
Chinoy, P.B. Processing and electrical characterization of multilayer metallization for microwave applications, ISHM–Microelectronic Society, vol. 2575, Apr. 19–21, 1995, p.203–8 of 572 pp. 7 refs., Abstract only.*
An Article entitled "Military Specification Insulating Compound, Electrical (For Coating Printed Circuit Assemblies)" from Departments and Agencies of the Department of Defense, MIL–I–46058C (Jul. 7, 1972).

* cited by examiner

Primary Examiner—George Fourson
Assistant Examiner—Suk-San Foong
(74) Attorney, Agent, or Firm—Ingrassia Fisher & Lorenz, P.C.

(57) ABSTRACT

A moisture resistant conformal coating (14) effectively protects high frequency circuits such as gallium arsenide MMICs from humidity and environmental contamination without the performance degradation inherent in conventionally applied conformal coatings. The conformal coating preferably comprises an organic polymer, such as silicone, applied to the MMIC die in a substantially uniform thickness of less than 0.002 inches, preferably of less than 0.0015 inches. This is accomplished by applying the organic polymer directly to the surface of the die (10) in a mixture containing the solid organic polymer diluted with a low surface tension solvent, such as a volatile methyl siloxane.

12 Claims, 2 Drawing Sheets

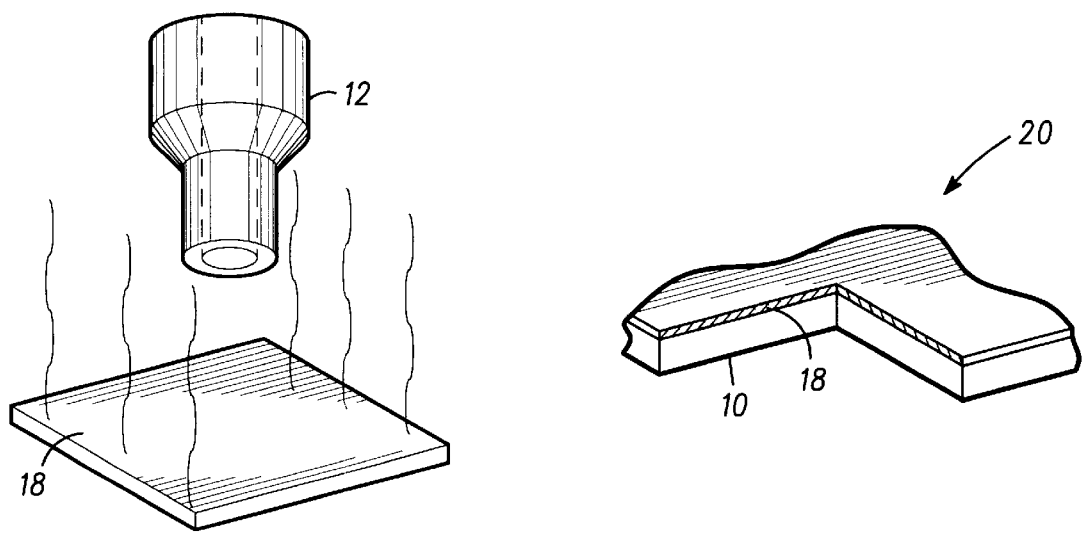
FIG. 5
FIG. 6
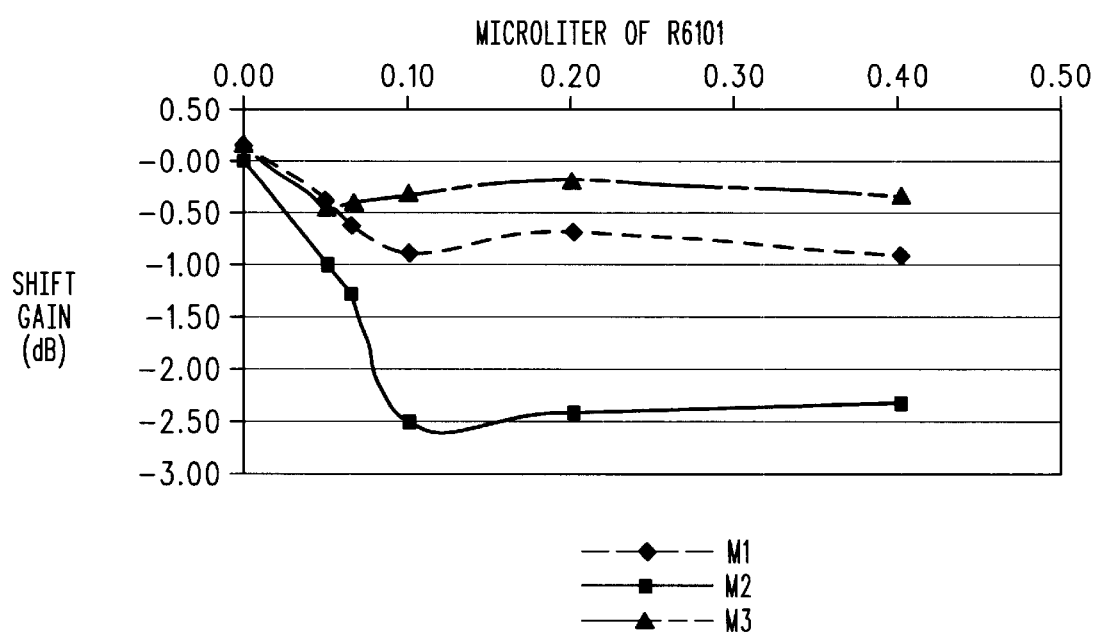
FIG. 7

HIGH FREQUENCY GALLIUM ARSENIDE MMIC DIE COATING METHOD

FIELD OF THE INVENTION

This invention relates to electronics packaging, more particularly to a method of conformally coating monolithic microwave integrated circuits (MMIC).

BACKGROUND OF THE INVENTION

Integrated circuits used in micro/millimeter operating frequency applications are subject to attenuated performance (gain perturbation) when the circuits are subjected to moist environments. (As used herein, the term micro/millimeter frequencies refers to microwave and millimeter wave frequencies at or above 8 GHz.) Because of their moisture sensitivity, the integrated circuit chips used in these applications have traditionally required encapsulation o f to prevent moisture contamination of the circuit surfaces.

Accelerated aging test procedures such as EIA/JEDEC STANDARD, Steady State Temperature Humidity Bias Life Test, Test Method A101-B, are used to simulate the long-term reliability of non-hermetically sealed solid-state devices in humid environments. In the JEDEC test, the circuits are exposed, while in operation, to conditions of 85% relative humidity at a temperature of 85° C. for a 1000 hour duration for the purpose of predicting their long-term reliability in humid environments (Mean Time to Failure or "MTTF").

The difficulty with high frequency circuit encapsulation lies with the sensitivity of these types of circuits to most conformal coating/encapsulation materials. In general, coating materials applied in direct contact with the MMIC surface are applied in coating thicknesses of 0.005+/−0.003 inches according to specifications such as MIL-I-46508. These relatively thick coatings in direct contact with the MMIC surfaces result in unacceptably high degrees of attenuated performance in high frequency applications. Therefore, in order to provide environmental resistance without the performance degradation inherent in conventional conformal coatings, traditionally, the MMIC circuitry is housed in a sealed container, usually made of metal or ceramic such that the MMIC operates in a hermetically sealed and isolated environment. Although effective, this packaging technique is expensive both in terms of component cost and assembly labor and, where gallium arsenide products are used, hermetic packaging may introduce hydrogen contamination from the nickel alloys used in the packaging.

Accordingly, what is needed is a method of applying a conformal coating to the surface of a MMIC chip in a substantially uniform, thin layer, such that the conformal coating is essentially invisible to the MMIC circuitry and, therefore, does not result in substantial attenuated performance.

BRIEF DESCRIPTION OF THE DRAWINGS

FIG. 5 is an illustration of the MMIC die surface as the evaporation of the diluent component of the coating mixture nears completion.

FIG. 6 is an illustration of an enlarged detail of one corner of the MMIC die showing the residual conformal coating of the organic polymer adhered to the surface.

FIG. 7 is a performance chart the gain of the MMIC die versus the applied thickness of conformal coating.

DETAILED DESCRIPTION

Figure 1:
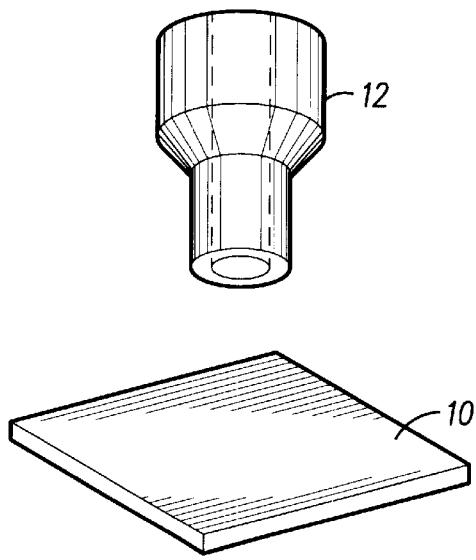
FIG. 1 is an illustration of the various components used in a method incorporating features of the invention.

According to the present invention, a moisture resistant conformal coating effectively protects high frequency circuits such as gallium arsenide MMICs from humidity and environmental contamination without the performance degradation inherent in conventionally applied conformal coatings. According to a preferred embodiment, a conformal coating comprising an organic polymer, preferably comprising parylene, polyurethane or silicone, and most preferably comprising silicone is applied to the MMIC die in a substantially uniform thickness of less than 0.002 inches, preferably of less than 0.0015 inches. (As used herein, substantially uniform thickness as used herein means the thickness varies no more than 30 per cent from the mean thickness.)

As shown in FIGS. 1 through 6 a method of manufacturing a moisture resistant semiconductor device such as a micro/millimeter wave gallium arsenide substrate monolithic microwave integrated circuit (MMIC) comprises applying a thin, moisture resistant, conformal coating comprising an organic polymer 14, to the semiconductor die 10. The organic polymer 14 may be any organic polymer used for moisture resistant conformal coating, but is preferably, parylene, polyurethane or silicone, and is most preferably silicone. Preferably the organic polymer contains low concentrations of ionic materials (less than 2ppm of potassium, sodium and chlorine). A preferred silicone compound meeting the above criteria is Dow Corning HIPEC R-6101.

In order to achieve the uniformly thin coating necessary to provide the appropriate level of moisture protection without attenuation of performance, the inventors of the present invention discovered that the organic polymer must be applied directly to the surface of the die in a mixture containing the solid organic polymer diluted with a low surface tension solvent (as used herein, low surface tension solvent means a solvent having a surface tension of less than 21.79 dynes/cm$^2$, preferably less than 21.0 dynes/cm$^2$, and most preferably from 15.1 to 21.0 dynes/cm$^2$). Use of a conventional solvent such as Acetone, Methyl Ethyl Ketone (MEK), Toluene or Alcohol resulted in a coating having an unacceptably high coating thickness in the center of the die and/or an unacceptably thin coating thickness at the edges of the die. Although not wishing the invention to be constrained to any particular theory of operation, the inventors of the present invention determined that as the conventional solvents evaporated, the surface tension of the solvents caused the remaining mixture to be drawn toward the center of the die. If a high concentration of solids were used with a conventional solvent in order to achieve acceptable coating thickness at the edges of the die, the thickness at the center would exceed 0.002 inches and the performance of the MMIC circuitry would be degraded unacceptably. If a low concentration of solvents were used with a conventional solvent in order to achieve acceptable coating thickness at the center of the die, the coating thickness at the edges of the die would be essentially nonexistent.

It was further discovered by the inventors of the present invention that a solvent having lower volatility, such as a volatile methyl siloxane is preferable to highly volatile solvents such as Pentane, which has a low surface tension (15.48 dynes/cm$^2$) but also has a relatively low flash point. Accordingly, volatile methyl siloxanes were determined to be the most preferable solvents. A preferred volatile methyl siloxane meeting the foregoing criteria is Dow Corning HIPEC Q2-1345, which has a surface tension of 17.8 dynes/cm$^2$ and a flash point of 230 degrees Fahrenheit.).

In order to achieve the appropriate viscosity for application and even flow onto the die (as well as controlling the total amount of solids deposited), the inventors of the present invention determined that the concentration of the organic polymer in the diluent should be less than 50% by weight, most preferably from 4% to 35% by weight and most preferably 25+/–2% by weight.

The quantity of coating mixture to be applied to each MMIC die is carefully controlled by the use of a commercially available apparatus such as a micro droplet dispenser 12, which forms uniform droplets of a precisely controlled size. Alternatively, any conventional precisely controllable methods of applying liquids, such as in jets or ultrasonic spray nozzles may be used for application of the coating mixture to the MMIC die 10 in accordance with the present invention. For MMIC die having dimensions of approximately from 1.7 mm by 1.0 mm to 3.2 mm by 1.7 mm, a drop of material of from 0.1 to 0.3 microliters with 25% concentration of solids provided adequate coverage without running off the edges of the die.

Figure 2:
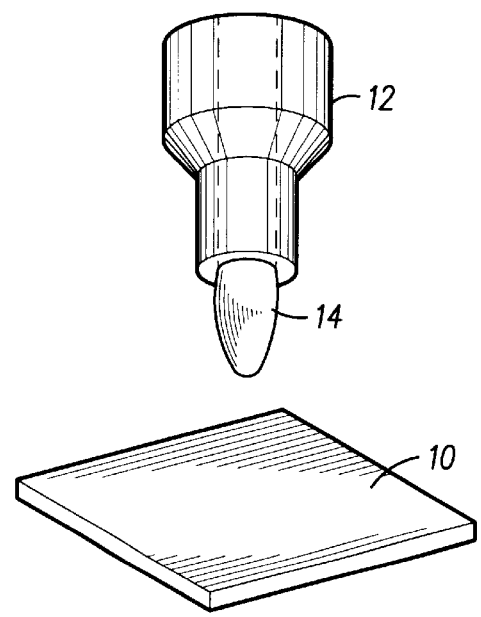
FIG. 2 is an illustration of a process by which a measured amount of the coating mixture is formed prior to application to the MMIC die surface.
Figure 3:
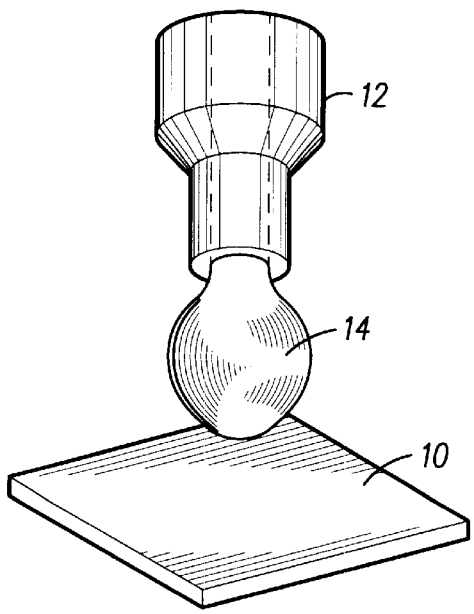
FIG. 3 is another illustration of a process by which a measured amount of the coating mixture is formed prior to application to the MMIC die surface.
Figure 4:
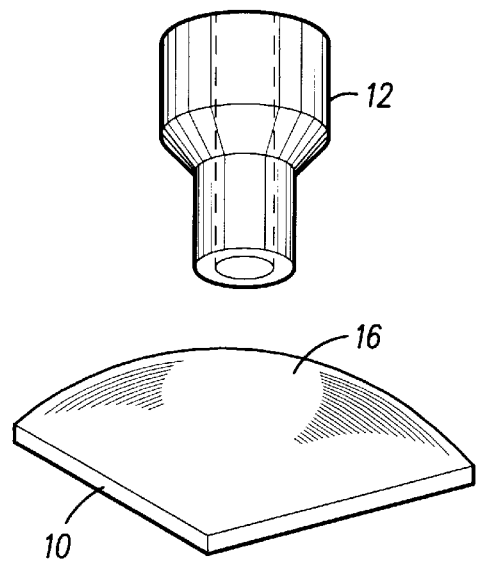
FIG. 4 is an illustration of the MMIC die surface after deposition of a measured amount of the coating mixture.

As shown in FIGS. 2 and 3, when using a micro droplet dispenser, the controlled amount of coating mixture is allowed to form a droplet 14 at the tip of 12 micro dispenser tube tip 12. Once the measured amount of coating mixture has been dispensed, it is applied to the exterior surface of the MMIC die 10 (FIG. 4) forming a bead of coating mixture 16 that wets the surface of the MMIC die and extends to the edges of the die. When applied in the appropriate amount, the coating mixture bubble 16 is held in a stable position on the MMIC die surface by the surface tension of the coating mixture without running off the edges of the die.

The diluent component of the pre-measured coating mixture 16 upon the surface of the MMIC die 10 is permitted to evenly evaporate as shown in FIG. 5, thus leaving a thin residual substantially uniform layer of the organic polymer 18 (FIG. 6) less than 0.002 inches thick adhered to and evenly distributed over the MMIC die surface 20. Although the organic layer is a dielectric in direct contact with the MMIC circuitry, because the thickness of the organic layer is uniformly thin, it is relatively invisible to the MMIC circuitry and, therefore, results in no appreciable degradation in the MMIC circuit performance.

In an illustrative embodiment, a series of experiments were run to determine the effect of the organic polymer on the performance of various MMIC die from three different manufacturers. Lower quantities of material were obtained by dispensing 0.1 microliter of 10% R6101 silicone diluted with HIPEC Q2-1345 solvent onto the die. Higher quantities of material were obtained by increasing the concentration to 25% and applying up to 0.4 microliters of the conformal coating mixture. As shown in FIG. 7, the gain shift for two out of three devices (M1 and M2) operating in the 31 Gigahertz frequency range was less than 1 dB for coatings of up to 0.4 microliters at 25% concentration. The third device (m3), which had larger gate periphery than the other two devices, was more sensitive to the presence of the coating, but the gain shift was still less than 1 dB for coatings of up to 0.05 microliter.

As can be determined from the foregoing, a liquid dispensed organic polymer applied in accordance with the teachings of the present invention results in an organic silicone residue layer that is substantially uniform, moisture resistant, conformal seal extending from edge to edge of the MMIC die 10, which effectively seals the MMIC circuitry from the environment without the cost and hydrogen poisoning associated with hermetic seals and without the performance degradation inherent in conventional conformal sealing methods.

What is claimed is:

1. A method of manufacturing a semiconductor device comprising:
   selecting a micro/millimeter wave substrate having a surface;
   providing a moisture resistant conformal coating mixture, said moisture resistant conformal coating mixture comprising an organic polymer diluted with a low surface tension solvent;
   applying said moisture resistant conformal coating mixture directly to said surface without running off an edge of said surface; and
   curing said moisture resistant conformal coating mixture into a conformal coating having a substantially uniform layer having a thickness less than 0.002 inch.

2. The method of claim 1 wherein:
   said low surface tension solvent has a surface tension of less than 21.0 dynes/cm$^2$.

3. The method of claim 1, wherein:
   said low surface tension solvent has a surface tension of between 15.1 and 21.0 dynes/cm$^2$.

4. The method of claim 1, wherein:
   said low surface tension solvent comprises a volatile methyl siloxane.

5. The method of claim 1, wherein:
   said organic polymer comprises a silicone resin.

6. The method of claim 1, wherein: said moisture resistant conformal coating mixture comprises a concentration of less than 50% of said organic polymer by weight in said low surface tension solvent.

7. The method of claim 1, wherein:
   said moisture resistant conformal coating mixture comprises a concentration of between 4% and 35% of said organic polymer by weight in said low surface tension solvent.

8. The method of claim 1, wherein:
   said moisture resistant conformal coating mixture comprises a concentration of about 23% to 27% of said organic polymer by weight in said low surface tension solvent.

9. The method of claim 1, wherein:
   the step of applying said moisture resistant conformal coating mixture to said surface comprises dispensing a droplet of said conformal coating mixture onto said surface.

10. The method of claim 1, wherein:
    the step of applying said moisture resistant conformal coating mixture to said surface comprises propelling a plurality of droplets of said conformal coating mixture onto said surface.

11. The method of claim 10, wherein: said propelling is performed by means of an inkjet apparatus.

12. The method of claim 10, wherein:
    said propelling is performed by means of an ultrasonic spray nozzle.

* * * * *